United States Patent
Ward et al.

(10) Patent No.: US 9,224,435 B2
(45) Date of Patent: Dec. 29, 2015

(54) RADIATION-HARD PRECISION VOLTAGE REFERENCE

(71) Applicant: THE CHARLES STARK DRAPER LABORATORY, INC., Cambridge, MA (US)

(72) Inventors: Paul A. Ward, Dedham, MA (US); James S. Pringle, Newton, MA (US); Marc S. Weinberg, Needham, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 85 days.

(21) Appl. No.: 13/973,143

(22) Filed: Aug. 22, 2013

(65) Prior Publication Data

US 2015/0054589 A1 Feb. 26, 2015

(51) Int. Cl.
| | |
|---|---|
| *H03B 5/30* | (2006.01) |
| *H03B 5/36* | (2006.01) |
| *G11C 5/14* | (2006.01) |
| *G11C 5/00* | (2006.01) |
| *G11C 7/04* | (2006.01) |

(52) U.S. Cl.
CPC ............... *G11C 5/147* (2013.01); *G11C 5/005* (2013.01); *G11C 7/04* (2013.01); *H03B 5/30* (2013.01); *H03B 5/36* (2013.01)

(58) Field of Classification Search
CPC .......... H03B 5/30; H03B 5/366; G11C 5/147; G11C 5/005; G11C 7/04
USPC ........... 331/1 R, 73, 116 R, 116 M, 154, 156, 331/158; 73/1.77, 504.04, 504.12, 504.14
See application file for complete search history.

(56) References Cited

U.S. PATENT DOCUMENTS

| | | | |
|---|---|---|---|
| 4,891,611 A | * | 1/1990 | Frerking ..................... 331/158 |
| 5,783,973 A | | 7/1998 | Weinberg et al. |
| 8,183,946 B2 | * | 5/2012 | Steeneken et al. ............ 331/156 |
| 2008/0315962 A1 | * | 12/2008 | Anderson et al. .............. 331/69 |

OTHER PUBLICATIONS

Schwartz, George, N., "A Novel Precision Voltage Reference Using a Micromechanical Resonator," B.S. Applied Physics, US Air Force Academy, 1996, Submitted to the Department of Electrical Engineering and Computer Science in Partial Fulfillment of the Reqirements for the Degree of Master of Science in Electrical Engeering at the Massachusetts Institute of Technology, Jun. 1998, 131 pages.

* cited by examiner

*Primary Examiner* — Richard Tan
(74) *Attorney, Agent, or Firm* — Lando & Anastasi LLP

(57) ABSTRACT

According to one aspect, embodiments herein provide a PVR comprising a resonator having an oscillation frequency, the resonator comprising at least one proof-mass, a mechanical reference, at least one drive plate located adjacent a first side of the at least one proof-mass, and at least one sense plate located adjacent a second side of the at least one proof-mass, a voltage source coupled to the drive and sense plates, a reference oscillator configured to provide a reference signal having a reference frequency to the voltage source; and an output, wherein the voltage source is configured to provide a bias voltage signal to the at least one drive and at least one sense plates of the resonator to drive the oscillation frequency of the resonator to match the reference frequency, and wherein the bias voltage signal is also provided to the output of the PVR as a voltage reference signal.

19 Claims, 4 Drawing Sheets

RADIATION-HARD PRECISION VOLTAGE REFERENCE

BACKGROUND

The lack of availability of an ultra high precision radiation-hard Precision Voltage Reference (PVR) has influenced the development of technology options for high performance inertial instruments over the past several decades. Accordingly, there have been a number of different techniques pursued with the goal of developing such a radiation-hard PVR (RHPVR). Some of the ideas pursued include the exploitation of: the negative resistance of a tunnel diode, nuclear magnetic resonance, electron-spin resonance, a compensated semiconductor avalanche diode, and the rebalancing of a pendulum against a permanent magnet. Unfortunately, no technique to date has resulted in a device or circuit having suitable performance.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

SUMMARY OF INVENTION

Figure 1:
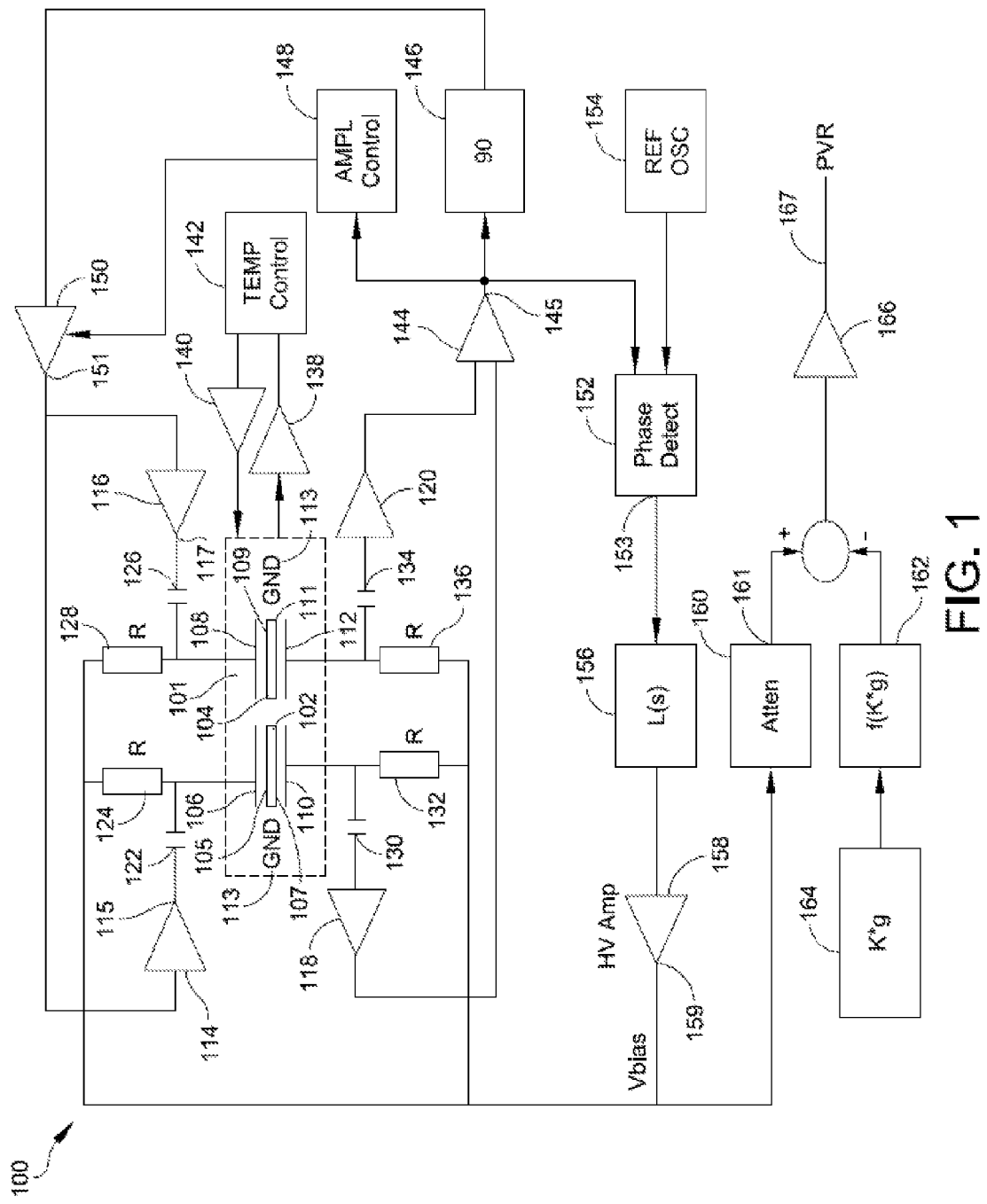
FIG. 1 is a block diagram of one example of a RHPVR according to aspects of the invention.

Aspects and embodiments are directed to a Precision Voltage Reference (PVR) based on the mechanical properties of a MEMS (Micro-Electro-Mechanical System) resonator, which are inherently radiation-hard. The MEMS based Radiation-Hard Precision Voltage Reference (RHPVR) can attain greatly improved radiation hardness compared to current state-of-the-art radiation-hard voltage references, which are typically based solely on radiation sensitive electrical components such as diodes and/or transistors. According to one embodiment, the oscillation frequency of the MEMS resonator is set equal to a stable reference frequency. Accordingly, a precision voltage reference may be produced as only a specific stable bias voltage applied to the MEMS resonator will result in the oscillation frequency of the MEMS resonator matching the reference frequency.

According to one embodiment, the RHPVR also includes specific-force compensation to enable use in a dynamic environment such as would be encountered in an inertial navigation system, which is subject to acceleration or a changing orientation with regard to the Earth's gravity field. According to another embodiment, the RHPVR may also include temperature control and/or compensation. A specific-force and/or temperature compensated RHPVR, as described herein, enables improved radiation-hard inertial sensors (i.e., simpler and more reliable radiation-hard inertial sensors) to be used in high performance inertial navigation systems.

At least one aspect described herein is directed to a Precision Voltage Reference (PVR) comprising a resonator having an oscillation frequency, the resonator comprising at least one proof-mass, a mechanical reference coupled to the at least one proof-mass, at least one drive plate located adjacent a first side of the at least one proof-mass, and at least one sense plate located adjacent a second side of the at least one proof-mass, a voltage source coupled to the at least one drive and the at least one sense plates, a reference oscillator configured to provide a reference signal having a reference frequency to the voltage source; and an output, wherein the voltage source is configured to provide a bias voltage signal to the at least one drive and at least one sense plates of the resonator to drive the oscillation frequency of the resonator to match the reference frequency, and wherein the bias voltage signal is also provided to the output of the PVR as a voltage reference signal. In one embodiment, the at least one drive plate and the at least one sense plate are symmetrical about the at least one proof-mass.

According to one embodiment, the PVR further comprises a specific-force compensation module coupled to the output of the PVR and configured to be coupled to an accelerometer, wherein the specific-force compensation module is configured to adjust the voltage reference signal at the output based on a measured acceleration of the PVR received from the accelerometer. In one embodiment, the specific-force compensation module is further configured to generate a specific-force adjustment signal based on the measured acceleration of the PVR and to subtract the specific-force adjustment signal from the voltage reference signal to generate a specific-force compensated voltage reference signal at the output.

According to another embodiment, the at least one proof-mass includes a first proof-mass and a second proof-mass, the at least one drive plate includes a first drive plate located adjacent a first side of the first proof-mass and a second drive plate located adjacent a first side of the second proof-mass, and the at least one sense plate includes a first sense plate located adjacent a second side of the first proof-mass and a second sense plate located adjacent a second side of the second proof-mass.

According to one embodiment, the PVR further comprises a differential amplifier coupled to the first and second sense plates and configured to generate a pick-off signal based on the difference between an AC signal sensed on the first sense plate and an AC signal sensed on the second sense plate. In one embodiment, the PVR further comprises a phase shift module coupled to the differential amplifier and configured to apply a phase shift to the pick-off signal from the differential amplifier and generate a phase shifted pick-off signal. In another embodiment, the phase shift module is adaptive. In one embodiment, the phase shifted pick-off signal from the phase shift module is provided to the first and second drive plates to excite the resonator into a sense-axis mode.

According to another embodiment, the PVR further comprises an amplitude control module coupled to the differential amplifier and configured to adjust the phase shifted pick-off signal provided to the first and second drive plates to maintain a constant oscillation amplitude of the resonator in the sense-axis mode. In one embodiment, the PVR further comprises a limiter coupled between the phase shift module and the first and second drive plates, wherein the amplitude control module is further configured to operate the limiter to adjust the phase shifted pick-off signal provided to the first and second drive plates to maintain a constant oscillation amplitude of the resonator in the sense-axis mode.

According to one embodiment, the voltage source comprises a phase detector coupled to the differential amplifier and the reference oscillator and configured to generate a phase difference signal based on a difference between a frequency of the pick-off signal and the reference frequency of the reference signal. In another embodiment, the voltage source further comprises a filter coupled to the phase detector and configured to receive and filter the phase difference signal to generate a filtered phase difference signal, and an amplifier coupled between the filter and each one of the at least one drive and sense plates and configured to receive the filtered phase difference signal and to generate the bias voltage signal based on the filtered phase difference signal.

According to another embodiment, the PVR further comprises an attenuator coupled between the amplifier of the voltage source and the output. In another embodiment, the PVR further comprises a temperature control module coupled to the resonator and configured to sense a temperature of the resonator and operate a temperature control element to maintain the temperature of the resonator at a constant level. In one embodiment, the resonator is a Micro-Electro-Mechanical System (MEMS).

Another aspect described herein is directed to a method for generating a precision voltage reference signal with a resonator having at least one proof mass, a mechanical reference coupled to the at least one proof-mass, at least one drive plate located adjacent a first side of the at least one proof-mass, and at least one sense plate located adjacent a second side of the at least one proof-mass, the method comprising receiving a reference signal having a frequency from a reference oscillator, providing a bias voltage signal to the at least one drive plate and the at least one sense plate to drive an oscillation frequency of the resonator to match the frequency of the reference signal, and providing the bias voltage signal as a voltage reference signal to a voltage reference output.

According to one embodiment, the method further comprises compensating the voltage reference signal at the voltage reference output based on a measured acceleration of the resonator. In another embodiment, the method further comprises providing a pick-off signal to the at least one drive plate, sensing a displacement of the at least one proof-mass by measuring an AC signal on the at least one sense plate; and based on the displacement of the at least one proof-mass, generating the pick-off signal.

According to another embodiment, the method further comprises adjusting the pick-off signal to maintain a constant oscillation amplitude of the resonator. In another embodiment, the method further comprises adjusting a temperature of the resonator to maintain the temperature of the resonator at a constant level.

One aspect described herein is directed to a radiation-hard PVR comprising a resonator having an oscillation frequency, a reference oscillator configured to generate a reference signal having a frequency, an output, and means for applying a bias voltage signal to the resonator to drive the oscillation frequency of the resonator to match the frequency of a reference oscillator and for providing the bias voltage signal as a voltage reference signal to the output.

According to one embodiment, the radiation-hard PVR further comprises means for compensating the voltage reference signal at the output for specific-force.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with at least one of the objectives, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment.

DETAILED DESCRIPTION

Current state-of-the-art solid state voltage references are typically based on diodes and/or transistors. The properties of these devices affecting voltage stability have shown to be extremely difficult to make insensitive to radiation. As such, current state-of-the-art solid state voltage references typically fail to provide a radiation-hard voltage reference of the stability required for direct use in high performance inertial instruments. Accordingly, aspects and embodiments are directed to an RHPVR which provides state-of-the-art level voltage stability performance simultaneously with radiation hardness.

The RHPVR is enabled by the use of an inherently radiation-hard MEMS resonator, whose resonance frequency can be tuned over a large frequency range by the application of a bias voltage to the resonator. According to one embodiment, the MEMs resonator includes a grounded proof-mass that is tethered to a mechanical reference (i.e., mechanical ground) with mechanical supports and plates configured above and/or below the proof-mass. Increasing the bias voltage applied to the plates above and/or below the grounded proof-mass of the MEMS resonator increases the electrostatic force on the proof-mass in a way that reduces the effective spring constant imposed by the mechanical supports on the proof-mass.

It is appreciated that the resonance frequency of a MEMS resonator may drop by nearly an octave with increasing bias voltage applied to the plate(s). Accordingly, even very small bias voltage changes applied to the plate(s) may result in substantial changes in the resonator's resonance frequency. Accordingly, by controlling the DC bias voltage applied to the plate(s) so that the MEMS resonance frequency matches that of an externally-supplied reference signal, the bias voltage may be usable as a highly stable voltage reference, as the DC bias voltage must be maintained at the stable voltage reference level to drive the resonant frequency of the MEMS resonator to match the external reference signal.

It is also appreciated that the value of the reference voltage generated by the RHPVR may depend only on the radiation-hard mechanical properties of the MEMS resonator, the oscillation amplitude, and the external reference frequency (which may be produced with high stability even in a radiation environment). Accordingly, the RHPVR can be made extremely stable, radiation-hard, and insensitive to parameter changes associated with radiation sensitive active electronic components typically used to generate a comparable degree of stability in common solid state voltage references. According to at least one embodiment, the RHPVR design described herein also includes specific-force compensation to enable use in a dynamic environment and to adjust the voltage reference in response to acceleration or a changing orientation with regard to the Earth's gravity field. According to at least one embodiment, the RHPVR design described herein also includes temperature control and/or compensation, as discussed further below.

FIG. 1 is a functional block diagram of one example of an RHPVR 100. The RHPVR 100 includes a tuning fork resonator 101, sense charge amplifiers 118, 120, a sense differential amplifier 144, a phase shift module 146, an amplitude control module 148, an adjustable limiter 150, drive amplifiers 114, 116, a temperature control module 142, a reference oscillator 154, a phase detector 152, a filter 156, an amplifier 158, an attenuator 160, and an output buffer 166. The running fork resonator 101 includes a first proof-mass 102, a second proof-mass 104, a first drive plate 106, a second drive plate 108, a first sense plate 110, and a second sense plate 112.

Both the first proof-mass 102 and the second proof-mass 104 are coupled to ground 113. It is appreciated that, according to some embodiments, the ground 113 to which the proof-mass is coupled to may be a virtual ground at a non-zero voltage level. The first drive plate 106 is located adjacent a first side 105 of the first proof-mass 102, and the first sense plate 110 is located adjacent a second side 107 of the first proof-mass 102 that is opposite the first side 105. The second drive plate 108 is located adjacent a first side 109 of the second proof-mass 104, and the second sense plate 112 is located adjacent a second side 111 of the second proof-mass 104 that is opposite the first side 109. According to one embodiment, the first drive plate 106 and the first sense plate 110 are symmetrical about the first proof-mass 102 (i.e., the plate to proof-mass gap distance between the proof-mass 102 and each plate 106, 110 is the same), and the second drive plate 108 and the second sense plate 112 are symmetrical about the second proof-mass 104. However, in other embodiments, the plates may be non-symmetrical about the proof-mass.

The first sense plate 110 is AC coupled to an input terminal of the sense differential amplifier 144 via a capacitor 130 and a first sense charge amplifier 118. The first sense plate 110 is also DC coupled to an output 159 of the amplifier 158 via a resistor 132. The second sense plate 112 is AC coupled to an input terminal of the sense differential amplifier 144 via a capacitor 134 and a second sense charge amplifier 120. The second sense plate 112 is also DC coupled to the output 159 of the amplifier 158 via a resistor 136. The output 145 of the sense differential amplifier 144 is coupled to the phase shift module 146, the amplitude control module 148, and an input of the phase detector 152.

The amplitude control module 148 is also coupled to an input of the adjustable limiter 150. The phase shift module 146 is also coupled to an input of the adjustable limiter 150. The output 151 of the adjustable limiter is coupled to an input of both the first and second drive amplifiers 114, 116. An output 115 of the first drive amplifier 114 is AC coupled to the first drive plate 106 via a capacitor 122. The first drive plate 106 is also DC coupled to the output 159 of the amplifier 158 via a resistor 124. An output 117 of the second drive amplifier 116 is AC coupled to the second drive plate 108 via a capacitor 126. The second drive plate 108 is also DC coupled to the output 159 of the amplifier 158 via a resistor 128.

An input of the phase detector 152 is also coupled to the reference oscillator 154. An output 153 of the phase detector is coupled to an input of the amplifier 158 via the filter 156. The output 159 of the amplifier 158 is also coupled to an input of the attenuator 160. The output 161 of the attenuator is coupled to the output buffer 166.

As shown in FIG. 1, each sense plate 110, 112 and drive plate 106, 108 receives a DC bias voltage (Vbias) from the amplifier 158 through the resistors 124, 128, 132, 136. The first and second proof-masses 102, 104 are grounded. Accordingly, a DC voltage equal to Vbias is maintained on each sense plate 110, 112 and drive plate 106, 108. The DC bias voltage (Vbias) maintained on the plates 106, 108, 110, 112 generates electrostatic force between the plates 106, 108, 110, 112 and the proof-masses 102, 104, and drives the resonator 101 at its resonance frequency.

As described above, increasing the bias voltage (Vbias) applied to the plates 106, 108, 110, 112 above and/or below the grounded proof-masses 102, 104 of the MEMS resonator 101 increases the electrostatic force on the proof-masses 102, 104 in a way that reduces the effective spring constant imposed by the mechanical supports on the proof-masses 102, 104 and decreases the resonance frequency of the resonator 101. Alternatively, decreasing the bias voltage (Vbias) applied to the plates 106, 108, 110, 112 above and/or below the grounded proof-masses 102, 104 of the MEMS resonator 101 decreases the electrostatic force on the proof-masses 102, 104 in a way that increases the effective spring constant imposed by the mechanical supports on the proof-masses 102, 104 and increases the resonance frequency of the resonator 101.

AC signals provided to the drive plates 106, 108 by the drive amplifiers 114, 116 excite the resonator 101 into a sense-axis mode. For example, according to one embodiment, the first drive amplifier 114 provides an AC signal to the first drive plate 106 that is 180 degrees out of phase with the AC signal provided to the second drive plate 108 by the second drive amplifier 116. Applying AC signals that are 180 degrees out of phase to the first and second drive plates 106, 108 result in the proof-masses 102, 104 oscillating out-of-phase (i.e., in anti-parallel motion, also referred to as the sense-axis tuning fork mode). According to one embodiment, the AC signals provided to the drive plates 106, 108 by the drive amplifiers 114, 116 are attenuated by passive attenuators (not shown) located between the drive amplifiers 114, 116 and the drive plates 106, 108 to avoid overdriving the resonator 101 in sense-axis mode.

As the resonator 101 operates in sense-axis mode and the proof-masses 102, 104 oscillate out-of-phase, an AC signal is also generated on the first sense plate 110 that is 180 degrees out of phase with the AC signal generated on the second sense plate 112. It is appreciated that through the utilization of the capacitors 122, 126, 130, 134 and the resistors 124, 128, 132, 136, a relatively large DC voltage (i.e., PVR) may be applied to the plates 106, 108, 110, 112 through the resistors 124, 128, 132, 136 while relatively small AC voltage can be applied to the drive plates 106, 108 through the capacitors 122, 126 and relatively small AC signals can be measured on the sense plates 110, 112 through the capacitors 130, 134.

The displacement of the proof-masses 102, 104 (as they oscillate in the sense-axis mode) is electrically sensed by measuring the AC signals on the sense plates 110, 112. The AC signals on the sense plates 110, 112 are provided to the sense differential amplifier 144 via the sense charge amplifiers 118, 120. The sense differential amplifier 144 produces a pick-off signal at its output 145 which is the difference between the AC signal on the first sense plate 110 and the AC signal on the second sense plate 112. The difference between the AC signals on the sense plates 110, 112 corresponds to the vertical differential displacement between the two proof-masses 102, 104 when they are oscillating out-of-phase (i.e., in the sense-axis mode).

The pick-off signal is fed back as a differential drive signal with a phase shift (provided by the phase shift module 146) to the upper two drive plates 106, 108 via the drive amplifiers 114, 116 to maintain the resonator 101 oscillating near its resonance frequency. According to one embodiment, the phase shift provided by the phase shift module 146 is ninety degrees; however, in other embodiments the phase shift may be defined differently. It is appreciated that a phase shift module 146 having good frequency domain response (i.e., low phase error) will tend to exhibit poor transient response (i.e., will exhibit a relatively large settling time). A large settling time can be problematic during start-up of the resonator 101 as the transient response can interfere with the typically small signal needed to regenerate the oscillation of the resonator 101 at start up. Therefore, according to one embodiment, the phase shift module 146 is adaptive, having a good time-domain response for start-up of the resonator 101 and a good frequency-domain response to sustain an oscillation having good frequency stability.

According to one embodiment, the pick-off signal from the sense differential amplifier 144 is provided to an adjustable limiter 150 which also receives control signals from the amplitude control module 148. The amplitude control module receives the pick-off signal from the sense differential amplifier 144 and operates the adjustable limiter 150 to adjust the amplitude of the differential drive signal provided to the drive amplifiers 114, 116 to maintain relatively constant oscillation amplitude of the resonator 101.

For example, it is appreciated that while the resonator 101 is being driven at its resonance frequency in sense-axis mode, the resonator 101 appears as a low-pass filter with a low-frequency pole equal to the half-width of its resonance characteristic. Therefore, according to one embodiment, since the resonator 101 resembles an integrator for control purposes, the amplitude control module 148 is a recovered integrator (with ripple filtering). The amplitude control module 148 receives the pick-off signal from the sense differential amplifier 144 and drives the differential drive signal at the output 151 of the limiter 150 to a desired amplitude which is equal to the DC output of the amplitude control module 148. Accordingly, the amplitude control module 148 directly controls the amplitude of the differential drive signal provided to the drive amplifiers 114, 116 (from the limiter 150) based on the pick-off signal to maintain relatively constant oscillation amplitude of the resonator 101.

The pick-off signal from the sense differential amplifier 144 is also provided to the phase detector 152. The phase detector 152 (or phase comparator) also receives an external reference signal from the reference oscillator 154 and compares the frequency of the pick-off signal (corresponding to the self-oscillation frequency of the resonator 101) to the frequency of the external reference signal. According to one embodiment, the phase detector 152 is an exclusive-OR logic gate; however, in other embodiments, other types of detectors or comparators may be used.

A signal representing the difference between the self-oscillation frequency of the resonator 101 and the reference frequency of the external reference signal is output by the phase detector 152. The output of the phase detector 152 is filtered by the filter 156 and amplified by the amplifier 158 to generate the bias voltage (Vbias) which is provided to the drive plates 102, 104 and sense plates 110, 112 as discussed above, to maintain the oscillation of the resonator 101. By deriving the MEMS bias voltage (Vbias) from an amplified and filtered version of the phase detector 152 output, the phase difference between the self-oscillating resonator 101 and the external reference oscillator 154 can be driven to a constant value. This forms a Phase-Locked Loop (PLL), which controls the bias voltage (Vbias) so that the oscillation frequency of the resonator 101 is locked to the frequency of the reference oscillator 154.

The bias voltage (Vbias) is also provided to the attenuator 160 which attenuates the bias voltage (Vbias) signal and provides the attenuated bias voltage signal to the output buffer 166. According to another embodiment, the attenuator 160 may be removed and the bias voltage from the amplifier 158 may be provided directly to the output buffer 166 or output 167 of the RHPVR.

The output buffer 166 provides the attenuated bias voltage to the output 167 of the RHPVR 100 as a PVR. According to one embodiment, the output buffer 166 is removed and the attenuated bias voltage from the attenuator 160 is provided directly to the output 167 of the RHPVR 100. It is appreciated that by controlling the bias voltage of the resonator 101 so that the oscillation frequency of the resonator 101 is locked to a highly-stable reference frequency, the bias voltage also becomes a very stable voltage reference.

It is also appreciated that by using a MEMS resonator 101 within the RHPVR 100 that includes symmetrical upper and lower plates (i.e., symmetrical drive plates 102, 104 and sense plates 110, 112), the sensitivity of the RHPVR 100 to specific-force (i.e., acceleration minus gravity) is reduced or even eliminated. However, due to mismatches in the plate to proof-mass gap distances caused by manufacturing tolerances, some sensitivity in the RHPVR 100 to specific-force may be present. Therefore, according to one embodiment, the RHPVR 100 also includes a specific-force compensation module 162.

Still referring to FIG. 1, the specific-force compensation module 162 is coupled to an accelerometer 164, the attenuator 160 and to the output buffer 166. According to one embodiment the accelerometer 164 is a low precision accelerometer that measures the vertical acceleration of the RHPVR 100 and provides a signal representing the vertical acceleration to the specific-force compensation module 162. According to one embodiment and as seen in FIG. 1, the signal provided from the accelerometer 164 to the specific-force compensation module 162 is shown as K*g, where g is the measured vertical acceleration. However, in other embodiments, any other appropriate type of accelerometer that measures acceleration in any direction may be used.

Based on the vertical acceleration signal from the accelerometer 164 and a specific-force compensation function (e.g., f(K*g)), the specific-force compensation module 162 adjusts the attenuated bias voltage from the attenuator 160 to compensate for any measured vertical acceleration of the RHPVR 100. According to one embodiment, the specific-force compensation function is computed by either analog or digital electronics within the specific-force compensation module 162.

According to one embodiment utilizing digital electronics, a Digital-to-Analog Converter (DAC) is used to create an analog signal to be subtracted from the attenuated bias voltage output by the attenuator 160 to adjust the PVR for the measured vertical acceleration. According to another embodiment, the reference frequency of the reference oscillator 154 is adjusted to offset the bias voltage (i.e., tune the PVR) in response to the measured vertical acceleration. According to another embodiment, the digital specific-force compensation information from the specific-force compensation module 162 is provided to an external system to be used by the external system to adjust or compensate the PVR. By adjusting the PVR for specific-force, a g-compensated PVR output of higher stability in dynamic environments is provided.

According to one embodiment, the RHPVR 100 is also compensated for temperature as variations in temperature may impact the stability of the PVR. According to one embodiment, the temperature control module 142 measures the temperature of the resonator 101 with a thermistor 138. In other embodiments, the temperature control module 142 may measure the temperature of the resonator 101 with another appropriate device. Based on the sensed temperature of the resonator 101, the temperature control module 142 operates a temperature control element 140 to maintain the temperature of the resonator 101 at a relatively constant level. For example, according to one embodiment, the temperature control element 140 is a heater and the temperature control module 142 operates the heater 140, based on the measured temperature of the resonator 101, to maintain the temperature of the resonator 101 at a relatively constant level. According to one embodiment, the heater 140 is a resistive heater; however, in other embodiments, any other type of temperature control element 140 may be utilized. By compensating the RHPVR 100 for temperature, the sensitivity of the RHPVR 100 to temperature change may be reduced.

According to one embodiment, the proof masses 102, 104 and supports (not shown) are made of silicon material; however, in other embodiments the proof masses 102, 104 and supports may be made of any appropriate material. According to one embodiment, the RHPVR 100 is attached to a glass (i.e., silicon dioxide) substrate. According to other embodiments, the RHPVR 100 may be attached to any other appropriate material (e.g., silicon). According to one embodiment, the RHPVR and glass substrate combination is placed inside of a vacuum (e.g., in a ceramic case); however, in other embodiments, any other type of case may be used.

As discussed above, the RHPVR 100 includes an amplitude controller 148; however, in other embodiments, the amplitude controller 148 may be removed as the variations in oscillation amplitude of the resonator 101 are negligible. As also described herein, the amplitude controller 148 maintains relatively constant oscillation amplitude of the resonator 101 through the use of an adjustable limiter 150; however, in other embodiments, the limiter 150 may be removed and the amplitude controller 148 may be configured differently to maintain the relatively constant oscillation amplitude of the resonator 101.

As discussed above, in one embodiment, the MEMS resonator 101 is a dual plate MEMS resonator including upper and lower plates about a proof-mass; however, in other embodiments, the MEMS resonator may be configured differently (e.g., with a single plate on one side of the proof-mass). Also as discussed above, the MEMS resonator 101 includes two proof-masses; however, in other embodiments, a single proof-mass may be used. According to other embodiments, any other appropriate proof-mass and plate configuration/geometry may be utilized.

As discussed above, the MEMS resonator 101 includes drive plates and sense plates that are adjacent a side of a proof-mass; however, in other embodiments, drive and/or sense plates may be located adjacent any other portion of a proof-mass (e.g., an edge of a proof-mass).

As discussed above, the MEMS resonator 101 includes forcers that are drive plates and pick-offs that are sense plates; however, in other embodiments, any other appropriate type of forcers and/or pick-off may be utilized.

As discussed above, the first and second proof-masses 102, 104 are coupled to ground. According to other embodiments, the first and second proof-masses 102, 104 may be coupled to a virtual ground having a voltage other than zero. In such an embodiment, the voltage between a plate and a proof mass would be the difference between the bias voltage applied to the plate and the voltage of the virtual ground (to which the proof mass is coupled).

As described above, the RHPVR 100 provides a stable PVR based on the mechanical properties of a MEMS resonator, which are inherently radiation-hard. In addition, the RHPVR 100 may further be stabilized through the use of control loops that are configured to maintain constant oscillation amplitude and to control the temperature of the RHPVR 100. Additionally, the RHPVR 100 also includes specific-force compensation to enable use in a dynamic environment. The underlying principles of the RHPVR 100 are discussed in greater detail below with regards to FIGS. 2-4.

Figure 2:
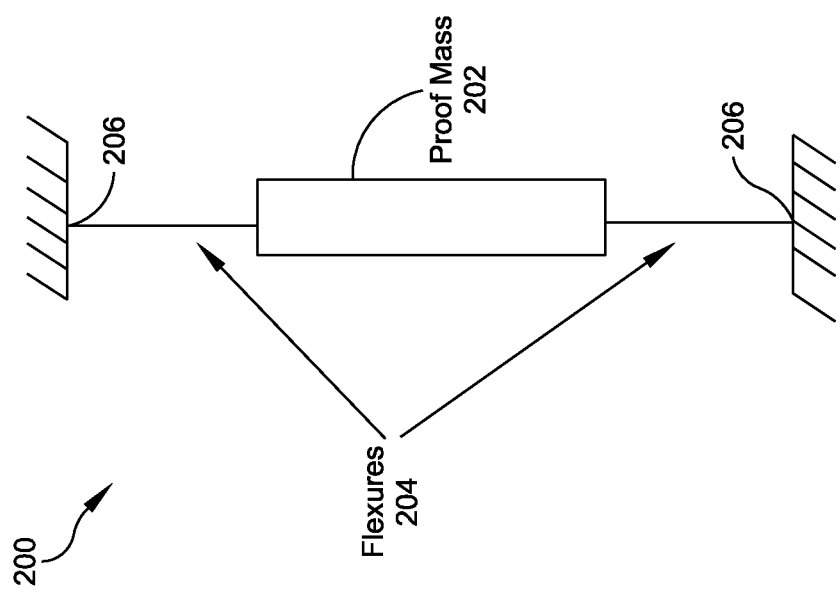
FIG. 2 is a block diagram of one example of a mass-spring system according to aspects of the invention.

FIG. 2 illustrates a mass-spring system 200. The mass-spring system 200 includes a proof-mass 202, tethers or flexures 204, and mechanical references 206. The mass-spring system based resonator 200 includes the proof-mass 202 tethered to the mechanical references 206 with tethers 204. The tethers 204 act like springs, and the movement of the mass 202 is constrained along the sense axis by the spring force, damping forces, inertial forces, and electrostatic forces.

Hooke's law is an approximation that the applied load (or force) needed to extend a spring is directly proportional to the amount of extension. A real spring requires more incremental force to produce a given incremental extension if its extension is greater to start with. The effect is mathematically expressed as cubic stiffening, called a "Duffing non-linearity". If the mass-spring system 200 is used in a self-oscillator (e.g., a MEMS resonator as discussed above), the non-linearity of the spring couples the mechanical oscillation amplitude to the natural frequency of the resonator. If a force is applied to the proof-mass 202, and if the force depends on (i.e. is proportional to) the proof-mass displacement, the force will have the effect of changing the effective spring stiffness. In the context of a self-oscillator, the force can then produce a change in the natural frequency of the mass-spring system.

Figure 3:
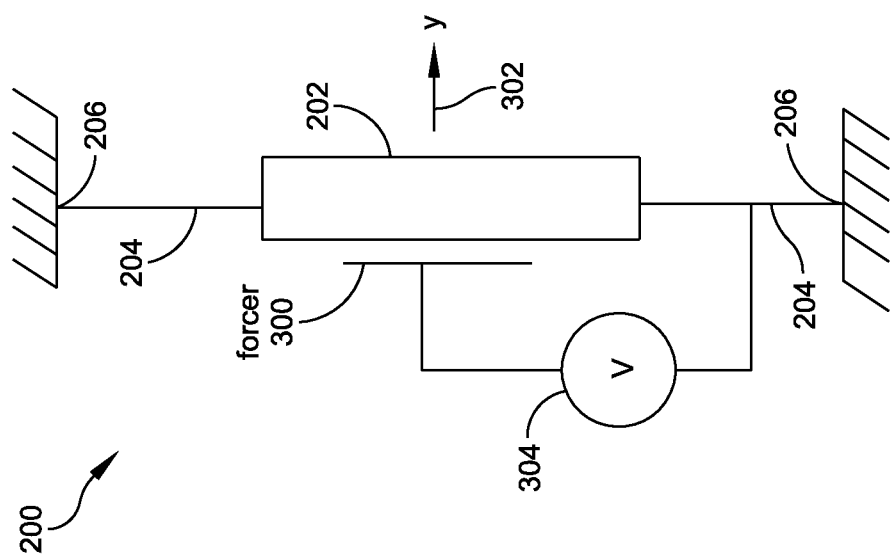
FIG. 3 is a block diagram of one example of a mass-spring system including a single forcer according to aspects of the invention.

FIG. 3 illustrates the mass-spring system 200 including an electrostatic (e.g., parallel-plate capacitive) forcer 300 that is coupled to a voltage source 304. Assuming that there is initially a voltage of zero volts applied to the forcer 300 by the voltage source 304 and the proof-mass 202 is displaced toward the forcer 300, the proof-mass 202 experiences a force in the positive y direction 302 applied by the flexures 204 (i.e., the spring). Assuming that a DC voltage is applied to the forcer 300 by the voltage source 304 and the proof-mass 202 is displaced toward the forcer 300, there is the same force (as when zero volts was applied to the forcer 300) applied in the positive y direction 302 by the flexures 204, but there is also an additional force applied in the negative y direction by the forcer 300. In both instances, the opposing forces increase in magnitude with the magnitude of the displacement. Thus, addition of the parallel-plate capacitive forcer 300 has the effect of "softening" the spring (i.e., reducing the spring stiffness). An increase in (mean-square) voltage applied to the forcer will increase this effect.

If the mass-spring system 200 is self-oscillating, the (mean-square) voltage applied to the forcer 300 by the voltage source 304 will modulate the natural frequency (and thus, the oscillation frequency) of the mass-spring system 200 (i.e., the resonator). The natural frequency is proportional to the square-root of the effective stiffness. Accordingly, the result is a mass-spring system 200 that is an electromechanical voltage controlled oscillator. By setting the oscillator frequency equal to a stable reference frequency, a precision voltage reference can be produced as only a particular voltage applied to the forcer 300 will result in the oscillation frequency of the system matching the reference frequency. The analytical formulation of this principal in relation to the spring-mass system 200 is discussed below. All forces acting on the proof-mass 202 are equated to obtain the equation of motion for the proof-mass 202. The equation of motion for the proof-mass along an axis perpendicular to the plane of a substrate to which the mass-spring system 200 is coupled is given by:

$$m\ddot{y} + b\dot{y} + k_1 y + k_3 y^3 = f_M + f_E$$

where:
m is the mass of the proof-mass;
b is the damping coefficient;
$k_1$, $k_3$ are the linear and cubic stiffness respectively;
$f_M$ is the applied mechanical force;
$f_E$ is the electrostatic force; and
y is the proof-mass displacement (e.g., a positive y widens gap between proof-mass 202 and forcer 300).

The spring force is given by:

$$f_s = -k_1 y - k_3 y^3$$

The electrostatic force is expressed as a constant force plus a term dependent upon displacement y. That is:

$$f_E = f_{EO} + \left(\frac{df}{dy}\right) y$$

The nominal electrostatic force is given by:

$$f_{EO} = -\frac{1}{2}\left(\frac{dC}{dy}\right)v^2 = -\frac{1}{2}\left(\frac{\varepsilon_o A}{Y_o^2}\right)v^2$$

Accordingly, for small displacements from a nominal proof-mass position, the electrostatic force is:

$$f_E \cong -\frac{1}{2}\left(\frac{\varepsilon_o A}{Y_o^2}\right)v^2 + \left(\frac{\varepsilon_o A}{Y_o^3}\right)v^2 y$$

Therefore, the equation of motion of the proof-mass 202 can be expanded as:

$$m\ddot{y} + b\dot{y} + \left(k_1 - \left(\frac{\varepsilon_o A}{Y_o^3}\right)v^2\right)y + k_3 y^3 = f_{EO} + f_m$$

It is to be appreciated from the above equation of motion that the applied voltage has the effect of reducing the spring stiffness if the applied voltage has a non-zero mean-square value. It is also to be appreciated that the applied voltage produces a "negative spring." A describing function analysis can be used to solve the expanded proof-mass equation of motion. For small displacements (i.e., much smaller than the gap between the proof-mass 202 and the forcer 300) the natural frequency of the system can be shown to be:

$$\omega_n = \sqrt{\frac{k_1 - \frac{\varepsilon_o A \langle v^2 \rangle}{Y_o^3} + \frac{3k_3 Y_p^2}{4}}{m}}$$

where:
$Y_p$ is the amplitude of oscillation;
$Y_o$ is the gap;
A is the proof-mass area; and
$\langle v^2 \rangle$ is the mean-square voltage across the gap.

From this natural frequency equation, it is appreciated that the mean-square applied forcer voltage has the effect of modulating the negative (electrostatic) spring coefficient, reducing the natural frequency with increased mean-square voltage.

The mean-square applied voltage is expressed in terms of a bias voltage (e.g., the PVR voltage) plus AC. That is:

$$v = PVR + \beta sq(\omega t)$$

Accordingly:

$$\langle v^2 \rangle = PVR^2 + \beta^2$$

Therefore, the natural frequency of the system can be written as:

$$\omega_N = \sqrt{\frac{k_1 + \frac{3}{4}k_3 Y_P^2 - \frac{\varepsilon_o A}{Y_o^3}(PVR^2 + \beta^2)}{m}} \text{ and}$$

$$\beta \cong \frac{bY_P Y_o^2 \omega_N}{\varepsilon_o A PVR}$$

The amplitude dependence caused by the Duffing non-linearity is potentially problematic for a high stability voltage reference. It is appreciated that this sensitivity may be reduced or even eliminated if the amplitude $Y_p$ can be set to a constant. This may be done by employing the PVR voltage in an amplitude detection function, as discussed above.

Assuming that the amplitude is constant (i.e., $Y_p = Y_c$), the natural frequency is given by:

$$\omega_N = \sqrt{\frac{k_1 + \frac{3}{4}k_3 Y_C^2 - \frac{\varepsilon_o A}{Y_o^3}(PVR^2 + \beta^2)}{m}} \text{ and}$$

$$\beta \cong \frac{bY_C Y_o^2 \omega_N}{\varepsilon_o A PVR}$$

With typical quality factor (Q) values of around 20,000, the value of $\beta$ is negligible compared to the PVR voltage and can be ignored. With natural frequency replaced by the oscillation frequency, the PVR voltage is given by:

$$PVR \cong \sqrt{\frac{Y_o^3}{\varepsilon_o A}\left[k_1 + \frac{3}{4}k_3 Y_C^2 - m\omega_o^2\right]}$$

It is appreciated, based on this PVR equation above, that the PVR voltage is radiation hard as it depends only upon mechanical and material properties, oscillation frequency, and mechanical oscillation amplitude. It may be convenient to express the PVR voltage in terms of quality factor (Q) rather than the damping factor (b). The quality factor and the damping factor are related by:

$$b = \frac{\omega_n m}{Q}$$

It is also appreciated that by replacing the natural frequency with the oscillation frequency, it is assumed that they are the same. However, this may only be true if the phase errors around the oscillator loop are zero.

The PVR voltage generated by a mass-spring system 200 may exhibit sensitivity to temperature, specific-force, and radiation. As long as the electronic components of the system are properly designed (i.e., appropriate electrical elements with mechanical and material properties that are relatively insensitive to radiation are chosen and the phase shifts are relatively stable), sensitivity to radiation is expected to be very small. The mass-spring system 200 may also exhibit sensitivity to specific-force and/or temperature; however, it is appreciated that compensating the PVR for specific-force and/or thermal sensitivity can be easily accomplished.

As discussed above, the mass-spring system may be sensitive to specific-force on the system. For example, a change in the gravity field will generally change the gap between the proof-mass 202 and the forcer 300 slightly. The maximum change in gap is computed by:

$$\Delta y_{max} = 2 \frac{mg_e}{k_1}$$

where $g_e$ is acceleration that would be produced by earth's gravity.

This represents a gravity change of 2 g, corresponding to rotating the PVR system 180 degrees when the sense axis is initially aligned with gravity. The resulting gap change is $1.2*10^{-9}$ meters. This corresponds to a PVR voltage shift of 600 ppm, or a sensitivity of 300 ppm/g. As discussed above, a mass-spring system (e.g., the RHPVR 100) may include a specific-force compensation module to adjust the PVR to compensate for such specific-force.

As also discussed above, the spring-mass system 200 may be sensitive to temperature. Assuming the electronics are designed properly, it is appreciated that only the spring-mass system 200 (i.e., the resonator) may need to be controlled to compensate for temperature. It is also appreciated that temperature control of the spring-mass system 200 to about 0.01 C may be required to produce a PVR with ultra high precision. As discussed above, a spring-mass system (e.g., the RHPVR 100) may include a temperature control module to compensate the spring-mass system 200 for temperature. It is also appreciated that temperature variations of the amplifiers that distribute the PVR voltage may also be restricted.

Figure 4:
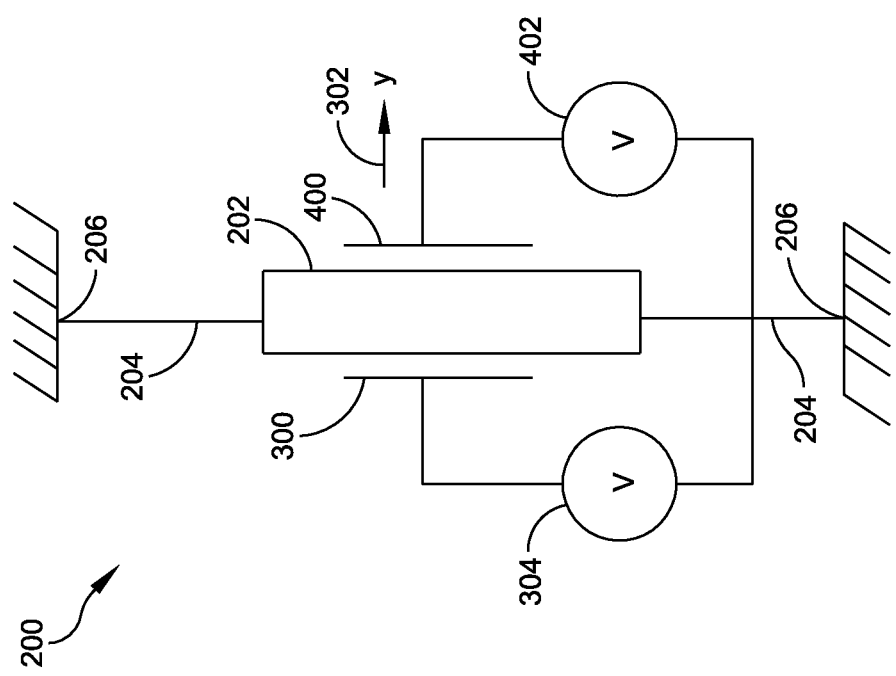
FIG. 4 is a block diagram of one example of a mass-spring system including dual forcers according to aspects of the invention.

As discussed above, in one embodiment, the proof-mass system 200 includes a single forcer 300. As illustrated in FIG. 4, the proof-mass system 200 may also include a second forcer 400 coupled to a second voltage source 402. It is appreciated that the addition of a second forcer 400 will increase the negative stiffness at a given PVR voltage. This may allow for a decrease in sensitivity to frequency. Additionally, as discussed above, addition of a symmetric sense plate may reduce specific-force sensitivity.

Assuming that the two forcers 300, 400 are matched, the electrostatic force term is:

$$f_E = 2\left(\frac{\varepsilon_o A}{Y_o^3}\right) v^2 y$$

Based on this electrostatic force equation, it is appreciated that by adding a second forcer 400, the negative stiffness term has doubled and the DC electrostatic forces (from the two forcer plates 300, 400) cancel. As the voltage increases, the proof-mass 202 remains in its equilibrium position because the DC electrostatic forces from the two plates 300, 400 cancel. Accordingly, the natural frequency of the system is given by:

$$\omega_N = \sqrt{\frac{k_1 + \frac{3}{4}k_3 Y_C^2 - 2\frac{\varepsilon_o A}{Y_o^3}(PVR^2 + \beta^2)}{m}}$$

and the PVR voltage is given by:

$$PVR \cong \sqrt{\frac{Y_o^3}{2\varepsilon_o A}\left[k_1 + \frac{3}{4}k_3 Y_C^2 - m\omega_o^2\right]}$$

To determine sensitivity of the dual forcer system to specific-force, the two forcer plates 300, 400 are treated separately. The electrostatic stiffness coefficient for the lower forcer plate (i.e., forcer plate 300) is:

$$k_{EL} = \frac{\varepsilon_o A_L}{(Y_{oL} + y)^3} v^2 = K_{EL} v^2$$

The electrostatic stiffness coefficient for the upper forcer plate (i.e., forcer plate 400) is:

$$k_{EU} = \frac{\varepsilon_o A_U}{(Y_{oU} - y)^3} = K_{EU} v^2$$

Accordingly the PVR voltage for the dual forcer system is given by:

$$PVR \cong \sqrt{\left(\frac{1}{K_{EL} + K_{EU}}\right)\left[k_1 + \frac{3}{4}k_3 Y_C^2 - m\omega_o^2\right]}$$

If the upper and lower forces from the dual forcers 300,400 are exactly matched, the g sensitivity is eliminated around g=0. It is appreciated that for nominal gaps matched to 1%, the g sensitivity has a magnitude of 6 ppm/g, and for 10% gap mismatch, the g sensitivity has a magnitude of 56 ppm/g. As described above, a PVR system may include a specific-force compensation module to adjust the PVR to compensate for such specific-force sensitivity.

The RHPVR described herein provides a stable PVR based on the mechanical properties of a MEMS resonator, which are inherently radiation-hard. The MEMS based Radiation-Hard Precision Voltage Reference (RHPVR) can attain greatly improved radiation hardness compared to current state-of-the-art radiation-hard voltage references, which are based solely on electrical components such as diodes and/or transistors. By setting the oscillation frequency of the MEMS resonator equal to a stable reference frequency, a precision voltage reference can be produced as only a specific stable bias voltage applied to the resonator will result in the oscillation frequency of the resonator matching the reference frequency. In addition, the RHPVR may further be stabilized through the use of control loops that are configured to maintain constant oscillation amplitude and to control the temperature of the RHPVR. Additionally, the RHPVR also includes specific-force compensation to enable use in a dynamic environment.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A Precision Voltage Reference (PVR) comprising:
a resonator having an oscillation frequency, the resonator comprising:
at least one proof-mass;
a mechanical reference coupled to the at least one proof-mass;
at least one drive plate located adjacent to a first side of the at least one proof-mass; and
at least one sense plate located adjacent to a second side of the at least one proof-mass;
a phase shift module coupled to the resonator and configured to apply a phase shift to a pick-off signal from the resonator to generate a bias signal;
an amplitude control module coupled to the resonator;
a voltage source coupled to the at least one drive and the at least one sense plates;
a reference oscillator configured to provide a reference signal having a reference frequency to the voltage source;
an output; and
a specific-force compensation module coupled to the output of the PVR and configured to be coupled to an accelerometer;
wherein the voltage source is configured to provide the bias signal to the at least one drive and at least one sense plates of the resonator to drive the oscillation frequency of the resonator to match the reference frequency;
wherein the amplitude control module is configured to adjust the bias signal provided to the at least one drive and the at least one sense plates to maintain a constant oscillation amplitude of the resonator;
wherein the bias signal is also provided to the output of the PVR as a voltage reference signal; and
wherein the specific-force compensation module is configured to adjust the voltage reference signal at the output based on a measured acceleration of the PVR received from the accelerometer.

2. The PVR of claim 1, wherein the at least one drive plate and the at least one sense plate are symmetrical about the at least one proof-mass.

3. The PVR of claim 1, wherein the specific-force compensation module is further configured to generate a specific-force adjustment signal based on the measured acceleration of the PVR and to subtract the specific-force adjustment signal from the voltage reference signal to generate a specific-force compensated voltage reference signal at the output.

4. The PVR of claim 1,
wherein the at least one proof-mass includes a first proof-mass and a second proof-mass,
wherein the at least one drive plate includes a first drive plate located adjacent a first side of the first proof-mass and a second drive plate located adjacent a first side of the second proof-mass, and
wherein the at least one sense plate includes a first sense plate located adjacent a second side of the first proof-mass and a second sense plate located adjacent a second side of the second proof-mass.

5. The PVR of claim 4, further comprising a differential amplifier coupled to the first and second sense plates and configured to generate the pick-off signal based on the difference between an AC signal sensed on the first sense plate and an AC signal sensed on the second sense plate.

6. The PVR of claim 5, wherein the phase shift module is coupled to the differential amplifier and is further configured to apply the phase shift to the pick-off signal from the differential amplifier to generate the bias signal.

7. The PVR of claim 6, wherein the phase shift module is adaptive.

8. The PVR of claim 6, wherein the bias signal from the phase shift module is provided to the first and second drive plates to excite the resonator into a sense-axis mode.

9. The PVR of claim 8, wherein the amplitude control module is coupled to the differential amplifier and is further configured to adjust the bias signal provided to the first and second drive plates to maintain the constant oscillation amplitude of the resonator in the sense-axis mode.

10. The PVR of claim 9, further comprising:
a limiter coupled between the phase shift module and the first and second drive plates,
wherein the amplitude control module is further configured to operate the limiter to adjust the bias signal provided to the first and second drive plates to maintain the constant oscillation amplitude of the resonator in the sense-axis mode.

11. The PVR of claim 5, wherein the voltage source comprises a phase detector coupled to the differential amplifier and the reference oscillator and configured to generate a phase difference signal based on a difference between a frequency of the pick-off signal and the reference frequency of the reference signal.

12. The PVR of claim 11, wherein the voltage source further comprises:
a filter coupled to the phase detector and configured to receive and filter the phase difference signal to generate a filtered phase difference signal; and
an amplifier coupled between the filter and each one of the at least one drive and sense plates and configured to receive the filtered phase difference signal and to generate the bias signal based on the filtered phase difference signal.

13. The PVR of claim 12, further comprising an attenuator coupled between the amplifier of the voltage source and the output.

14. The PVR of claim 1, further comprising a temperature control module coupled to the resonator and configured to sense a temperature of the resonator and operate a temperature control element to maintain the temperature of the resonator at a constant level.

15. The PVR of claim 1, wherein the resonator is a Micro-Electrical Mechanical System (MEMS).

16. A method for generating a precision voltage reference signal with a resonator having at least one proof mass, a mechanical reference coupled to the at least one proof-mass, at least one drive plate located adjacent a first side of the at least one proof-mass, and at least one sense plate located adjacent a second side of the at least one proof-mass, the method comprising:
receiving a reference signal having a frequency from a reference oscillator;
generating a pick-off signal based on operation of the resonator;
applying a phase shift to the pick-off signal to generate a bias voltage signal;

providing the bias voltage signal to the at least one drive plate and the at least one sense plate to drive an oscillation frequency of the resonator to match the frequency of the reference signal;

adjusting the bias voltage signal provided to the at least one drive and the at least one sense plates to maintain a constant oscillation amplitude of the resonator;

providing the bias voltage signal as a voltage reference signal to a voltage reference output; and compensating the voltage reference signal at the voltage reference output based on a measured acceleration of the resonator.

17. The method of claim 16, further comprising:

sensing a displacement of the at least one proof-mass by measuring an AC signal on the at least one sense plate; and based on the displacement of the at least one proof-mass, generating the pick-off signal.

18. The method of claim 17, further comprising adjusting a temperature of the resonator to maintain the temperature of the resonator at a constant level.

19. A radiation-hard Precision Voltage Reference (PVR) comprising:

a resonator having an oscillation frequency;

a reference oscillator configured to generate a reference signal having a frequency;

an output;

means for generating a pick-off signal based on operation of the resonator:

means for applying a phase shift to the pick-off signal to generate a bias voltage signal;

means for applying the bias voltage signal to the resonator to drive the oscillation frequency of the resonator to match the frequency of the reference oscillator and for providing the bias voltage signal as a voltage reference signal to the output;

means for adjusting the bias voltage signal applied to the resonator to maintain a constant oscillation amplitude of the resonator; and means for compensating the voltage reference signal at the output based on a measured acceleration of the resonator.

* * * * *